US012641864B2

(12) United States Patent
Song

(10) Patent No.: US 12,641,864 B2
(45) Date of Patent: May 26, 2026

(54) TRANSISTOR AND METHOD FOR FABRICATING THE SAME

(71) Applicant: SK hynix Inc., Icheon-si (KR)

(72) Inventor: Jeong Hwan Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 468 days.

(21) Appl. No.: 18/310,426

(22) Filed: May 1, 2023

(65) Prior Publication Data

US 2024/0170342 A1     May 23, 2024

(30) Foreign Application Priority Data

Nov. 21, 2022     (KR) ........................ 10-2022-0156419

(51) Int. Cl.
*H01L 21/477* (2006.01)
*H10D 84/01* (2026.01)
*H10D 84/03* (2025.01)
*H10P 14/60* (2026.01)
(Continued)

(52) U.S. Cl.
CPC ....... *H10D 84/038* (2025.01); *H10D 84/0181* (2025.01); *H10P 14/66* (2026.01); *H10P 32/172* (2026.01); *H10P 95/90* (2026.01)

(58) Field of Classification Search
CPC .......... H10D 30/60–798; H10D 30/021–0415; H10D 84/83–859; H10D 86/40–60; H10D 30/0223–0229; H10D 30/0215; H10D 30/0212
See application file for complete search history.

(56) References Cited

U.S. PATENT DOCUMENTS

| | | | |
|---|---|---|---|
| 9,960,350 B2 | 5/2018 | Ha | |
| 2006/0108585 A1* | 5/2006 | Gan | ................... H10D 30/0321 |
| | | | 257/E21.414 |
| 2017/0062234 A1* | 3/2017 | Bajaj | ................... H10D 62/832 |

(Continued)

FOREIGN PATENT DOCUMENTS

| | | |
|---|---|---|
| KR | 20170137562 A | 12/2017 |
| KR | 20210028794 A | 3/2021 |
| KR | 20210028974 A | 3/2021 |

OTHER PUBLICATIONS

Shukla, N., Thathachary, A., Agrawal, A. et al. A steep-slope transistor based on abrupt electronic phase transition. Nat Commun 6, 7812 (2015) (Year: 2015).*

(Continued)

*Primary Examiner* — Matthew C Landau
*Assistant Examiner* — Nora T. Nix
(74) *Attorney, Agent, or Firm* — Perkins Coie LLP

(57)     ABSTRACT

Transistors and methods for fabricating the transistors are disclosed. In some implementations, a transistor includes: a substrate; a gate electrode disposed over the substrate; a gate insulating layer disposed between the gate electrode and the substrate; one or more doped regions formed in the substrate; and one or more selector layers disposed over the substrate, at least one of the one or more selector layers vertically overlapping at least one of the one or more doped regions, wherein each of the one or more selector layers includes an insulating material layer and a dopant, wherein the insulating material layer includes a same material as the gate insulating layer, and the dopant is doped in the insulating material layer.

12 Claims, 3 Drawing Sheets

(51) Int. Cl.
    *H10P 32/10*        (2026.01)
    *H10P 95/90*        (2026.01)

(56)          References Cited

U.S. PATENT DOCUMENTS

2018/0025948 A1\*   1/2018   Cho ....................... H10D 84/85
                                          438/217
2018/0327894 A1\*  11/2018  Ou ........................ C23C 14/042

OTHER PUBLICATIONS

Ionescu, A. et al., "Tunnel field-effect transistors as energy-efficient electronic switches." Nature, vol. 479, Nov. 17, 2011, 9 pages.
Shukla, N. et al., "A steep-slope transistor based on abrupt electronic phase-transition." Nature Communications, 6:7812, 2015, 6 pages.

\* cited by examiner

TRANSISTOR AND METHOD FOR FABRICATING THE SAME

PRIORITY CLAIM AND CROSS-REFERENCE TO RELATED APPLICATION

This patent document claims the priority and benefits of Korean Patent Application No. 10-2022-0156419 filed on Nov. 21, 2022, which is incorporated herein by reference in its entirety.

TECHNICAL FIELD

This patent document relates to a semiconductor technology, and more particularly, to a transistor in a semiconductor device.

BACKGROUND

Transistors are the basic unit of a semiconductor device. With the recent increase in the use of various miniaturized, low-power, high-performance electronic devices, a new transistor design is needed to meet the requirements for reducing the size and power consumption of the transistors.

SUMMARY

The disclosed technology can be implemented in some embodiments to provide a low-power transistor that can be fabricated using simplified processes at a low. The disclosed technology can also be implemented in some embodiments to provide a method for fabricating the low-power transistor.

In some embodiments of the disclosed technology, a transistor may include: a substrate; a gate electrode disposed over the substrate; a gate insulating layer disposed between the gate electrode and the substrate; one or more doped regions formed in the substrate; and one or more selector layers disposed over the substrate, at least one of the one or more selector layers vertically overlapping at least one of the one or more doped regions, wherein each of the one or more selector layers includes an insulating material layer and a dopant, wherein the insulating material layer includes a same material as the gate insulating layer, and the dopant is doped in the insulating material layer.

In some embodiments of the disclosed technology, a method for fabricating a transistor may include: forming an insulating material layer over a substrate; forming a gate electrode over at least a first portion of the insulating material layer; forming a doped region at first and second regions of the substrate by implanting a first dopant into: the first region of the substrate adjacent to a side of the gate electrode; and the second region of the substrate adjacent to another side of the gate electrode; and forming a selector layer by implanting a second dopant into at least part of the insulating material layer disposed over at least one of the first region or the second region of the substrate.

DETAILED DESCRIPTION

Figure 1:
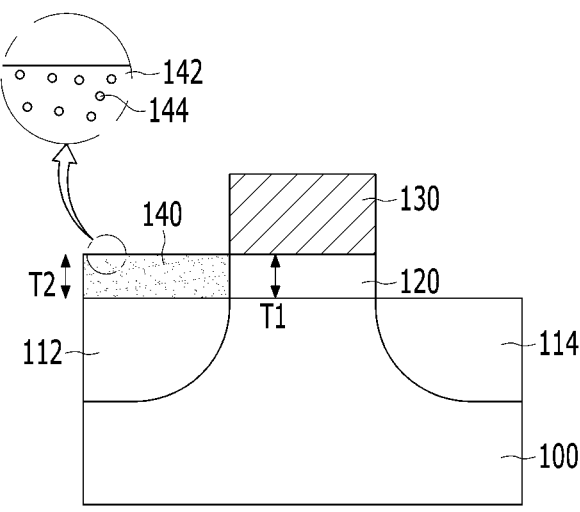
FIG. 1 is a cross-sectional view illustrating a transistor based on some embodiments of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a transistor based on some embodiments of the disclosed technology.

Referring to FIG. 1, a transistor implemented based on some embodiments of the disclosed technology may include a substrate 100, a first doped region 112 and a second doped region 114 formed in the substrate 100, and a gate insulating layer 120, a gate electrode layer 130, and a selector layer 140 that are formed over the substrate 100.

The substrate 100 may include at least one of silicon, germanium, or a combination thereof.

The first doped region 112 and the second doped region 114 may be disposed in the substrate 100 near or at both sides of the stacked structure of the gate insulating layer 120 and the gate electrode layer 130. One of the first doped region 112 and the second doped region 114 may function as a "source" of the transistor and the other of the first doped region 112 and the second doped region 114 may function as a "drain" of the transistor. Each of the first doped region 112 and the second doped region 114 may be formed by implanting a dopant into the substrate 100, for example, by performing an ion implantation process. The dopant may include an n-type dopant or a p-type dopant.

The gate insulating layer 120 may be disposed between the gate electrode 130 and the substrate 100 to insulate them from each other. The gate insulating layer 120 may include a silicon-containing insulating material such as silicon oxide, silicon nitride, or silicon oxynitride, an insulating metal oxide, an insulating metal nitride, or a combination thereof.

The gate electrode 130 may be disposed over the gate insulating layer 120, and may be formed to overlap a channel region defined between the first doped region 112 and the second doped region 114 in the substrate 100. The gate electrode 130 may have a single-layer structure or a multi-layer structure including various conductive materials. For example, the gate electrode 130 may include a metal such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), or bismuth (Bi), an alloy thereof, or a compound thereof.

The selector layer 140 may be disposed over the substrate 100, and may be formed to overlap the first doped region 112. However, the present disclosure is not limited thereto. In some embodiments, the selector layer 140 may overlap the second doped region 114 vertically over the substrate 100. In some embodiments, the selector layer 140 may overlap each of the first and second doped regions 112 and 114 vertically over the substrate 100. In some implementations, a selector may perform a threshold switching operation. For example, when the applied voltage is less than a predetermined threshold value, no or very slight current flows, but when the applied voltage exceeds the predetermined threshold value, the current flow rapidly increases. In this way, the selector can be turned on or off. The threshold value may include a threshold voltage, and the selector may be implemented in a turn-on state or a turn-off state based on the threshold voltage. Examples of the selector may include a diode, an OTS (Ovonic Threshold Switching) material such as a chalcogenide-based material, an MIEC (Mixed Ionic Electronic Conducting) material such as a metal-containing chalcogenide-based material, an MIT (Metal Insulator Transition) material such as $NbO_2$ or $VO_2$, or others.

In some embodiments of the disclosed technology, the selector layer 140 may include an insulating material layer 142 and a dopant 144 doped in the insulating material layer 142 by ion implantation.

The insulating material layer 142 may include a silicon-containing insulating material such as silicon oxide, silicon nitride, or silicon oxynitride, an insulating metal oxide, an insulating metal nitride, or a combination thereof. The insulating metal oxide may include, for example, aluminum oxide, zirconium oxide, hafnium oxide, tungsten oxide, titanium oxide, nickel oxide, copper oxide, manganese oxide, tantalum oxide, niobium oxide, or iron oxide. The insulating metal nitride may include, for example, aluminum nitride. In some implementations, deep traps may exist in the insulating material layer 142 to trap conductive carriers such as electrons. The energy level of the deep trap may be similar to the energy level of the valence band of the insulating material layer 142.

The dopant 144 fixed in the insulating material layer 142 may create a shallow trap that provides a passage for conductive carriers (e.g., electrons) to move in the insulating material layer 142. The energy level of the shallow trap generated by the dopant 144 may be higher than the energy level of the deep trap of the insulating material layer 142, and may be smaller than the energy level of the conduction band of the insulating material layer 142. To generate such a shallow trap, various elements different from those of the insulating material layer 142 may be used as the dopant 144 while generating the energy level capable of accommodating the conductive carriers in the insulating material layer 142. When the insulating material layer 142 contains silicon, the dopant 144 may include a metal having a different valence from silicon. For example, when the insulating material layer 142 includes silicon oxide or silicon nitride, the dopant 144 may include at least one of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), or arsenic (As). Alternatively, when the insulating material layer 142 contains a metal, the dopant 144 may include another metal having a different valence from the metal, or silicon. For example, when the insulating material layer 142 includes aluminum oxide or aluminum nitride, the dopant 144 may include at least one of titanium (Ti), copper (Cu), zirconium (Zr), hafnium (Hf), niobium (Nb), vanadium (V), tantalum (Ta), tungsten (W), chromium (Cr), molybdenum (Mo), boron (B), nitrogen (N), carbon (C), phosphorus (P), and arsenic (As).

When a voltage equal to or higher than the threshold voltage is applied to the selector layer 140, the conductive carriers trapped in the deep traps may jump to the shallow traps by thermal emission or tunneling, and the conductive carriers may move through the shallow traps. Accordingly, the selector layer 140 may have an "on" state to allow current to flow therethrough. On the other hand, when the voltage applied to the selector layer 140 is less than the threshold voltage, the number of the conductive carriers moving from the deep traps to the shallow traps may be reduced, thereby suppressing the movement of the conductive carriers through the shallow traps. Accordingly, the selector layer 140 may have an "off" state to prevent current from flowing therethrough. As a result, the selector layer 140 may have the threshold switching characteristic.

As will be described later, the selector layer 140 may be formed by doping a dopant into an insulating material for forming the gate insulating layer 120. For this reason, the insulating material layer 142 may be formed of the same material as the gate insulating layer 120. For example, when the gate insulating layer 120 includes silicon dioxide, the insulating material layer 142 may also include silicon dioxide. In addition, a thickness T2 of the selector layer 140 may be substantially equal to or smaller than a thickness T1 of the gate insulating layer 120 by a predetermined extent. The selector layer 140 may have a side surface directly contacting a side surface of the gate insulating layer 120 while being disposed at one side of the gate insulating layer 120.

The transistor implemented in some embodiments of the disclosed technology can have advantages over conventional transistors (e.g., a transistor without the selector layer 140) as will be discussed below.

In order to reduce power consumption in the conventional transistor, it may be necessary to reduce a power supply voltage. However, due to a physical limitation of a sub-threshold slope of a transistor, leakage current may increase as the power supply voltage decreases, thereby increasing its energy consumption. Thus, a transistor with a steep sub-threshold slope may be required.

The transistor implemented based on some embodiments of the disclosed technology may satisfy a steep subthreshold slope by forming the selector layer 140 overlapping the first doped region 112 and/or the second doped region 114. This may be because of a steep on/off switching characteristic of the selector layer 140. As a result, a reduction in power consumption of the transistor implemented based on some embodiments of the disclosed technology may be possible.

Furthermore, since the transistor implemented based on some embodiments of the disclosed technology forms the selector layer 140 using a gate insulating material as will be discussed below, the fabrication process and cost may be reduced.

Figure 2A:
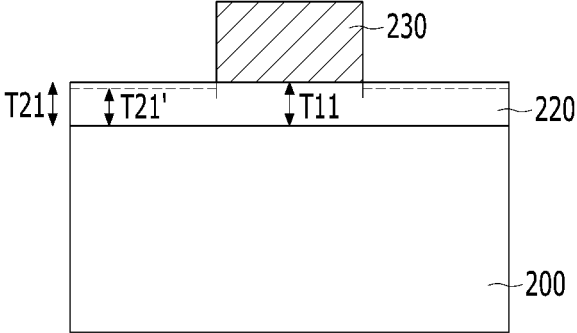
FIGS. 2A to 2C are cross-sectional views illustrating a method for fabricating a transistor based on some embodiments of the disclosed technology.
Figure 2B:
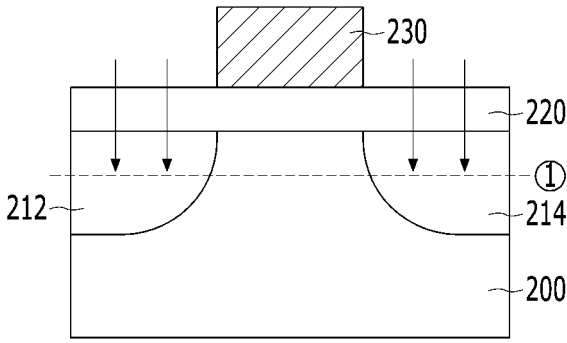
Figure 2C:
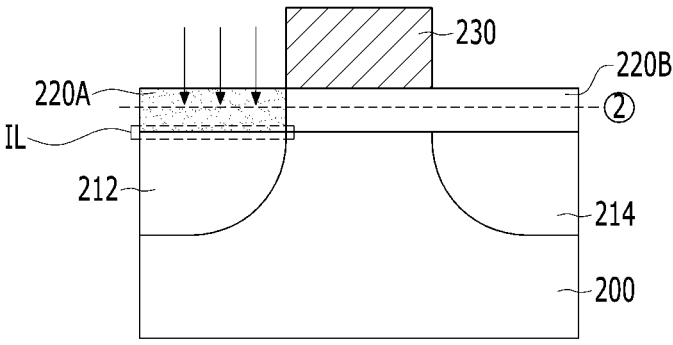

FIGS. 2A to 2C are cross-sectional views illustrating a method for fabricating a transistor based on some embodiments of the disclosed technology.

Referring to FIG. 2A, a substrate 200 including a semi-conductor material such as silicon may be provided.

Subsequently, an insulating material layer 220 may be formed over the substrate 200. The insulating material layer 220 may include a silicon-containing insulating material such as silicon oxide, silicon nitride, or silicon oxynitride, an insulating metal oxide, an insulating metal nitride, or a combination thereof. The insulating material layer 220 may be formed by various deposition methods such as chemical vapor deposition (CVD) and atomic layer deposition (ALD).

Subsequently, a gate electrode 230 may be formed over the insulating material layer 220. The gate electrode 230 may be formed by forming a conductive material layer over the insulating material layer 220 and patterning the conductive material layer through a mask and etching process. The conductive material layer may include a single layer or a multilayer structure that includes a plurality of layers stacked on top of one another. The etching process of the conductive material layer for forming the gate electrode 230 may be performed so that an upper surface of the insulating material layer 220 is exposed. During this etching process, a portion of the insulating material layer 220 exposed by the gate electrode 230 may or may not be removed. If the portion of the insulating material layer 220 remains, a thickness T21 of the portion of the insulating material layer 220 exposed by the gate electrode 230 may be substantially the same as a thickness T11 of another portion of the insulating material layer 220 overlapping the gate electrode 230. On the other hand, in this etching process, if the portion of the insulating material layer 220 exposed by the gate electrode 230 is removed to a certain extent by over-etching (see dotted line in FIG. 2A), a thickness T21' of the portion of the insulating material layer 220 exposed by the gate electrode 230 may be smaller than the thickness T11 of another portion of the insulating material layer 220 overlapping the gate electrode 230 by a predetermined amount. For example, the thickness T21' of the portion of the insulating material layer 220 exposed by the gate electrode 230 may have a range of 80% or more and less than 100% of the thickness T11 of another portion of the insulating material layer 220 overlapping the gate electrode 230.

Referring to FIG. 2B, a first dopant may be doped into the substrate 200 at both sides of the gate electrode 230 to form a first doped region 212 and a second doped region 214 (see arrows in FIG. 2A).

An element suitable for forming the first and second doped regions 212 and 214 may be used as the first dopant. Also, doping of the first dopant may be performed by ion implantation. Here, during the ion implantation, a projection range (Rp) point (see "①" in FIG. 2B) may be located within the first and second doped regions 212 and 214 in a vertical direction. That is, the Rp point may be located between the top surface and the bottom surface of each of the first and second doped regions 212 and 214. In some implementations, the projection range (or projected range) may indicate the distance that an ion travels vertically in a material layer. In some implementations, the Rp point may indicate the maximum distance that the ion travels vertically in the material layer, that is, a depth of ion implantation.

Since the doping of the first dopant is performed to form the first and second doped regions 212 and 214, the insulating material layer 220 does not contain the first dopant (or contain a very small amount of first dopant). That is, during the ion implantation, the first dopant may pass through the insulating material layer 220 and reach the substrate 200.

Referring to FIG. 2C, the selector layer 220A may be formed by doping a second dopant into the insulating material layer 220 at one side, for example, a left side of the gate electrode 230 in FIG. 2C (see arrows in FIG. 2C). Accordingly, the selector layer 220A may overlap the first doped region 220A, and may have a structure in which the insulating material layer 220 is doped with the second dopant.

In some implementations, any element that can create a shallow trap to provide a passage for conductive carriers such as electrons to move in the insulating material layer 220 may be used as the second dopant. When the insulating material layer 220 contains silicon, the second dopant may include a metal having a different valence from silicon. When the insulating material layer 220 contains a metal, the second dopant may include a metal having a different valence from the metal or silicon. Also, doping of the second dopant may be performed by ion implantation. Here, during the ion implantation, an Rp point (see "②" in FIG. 2C) may be located within the insulating material layer 220 and/or the selector layer 220A in the vertical direction, that is, between the top surface and the bottom surface of the selector layer 220A.

A portion of the insulating material layer 220 not doped with the second dopant, that is, a portion overlapping the gate electrode 230 and a portion disposed at another side, for example, a right side of the gate electrode 230 in FIG. 2C, may be referred to as a gate insulating layer 220B. The gate insulating layer 220B may be positioned between the gate electrode 230 and a channel region of the substrate 200 to insulate them from each other. In addition, in some embodiments of the disclosed technology, the gate insulating layer 220B may extend to overlap the second doped region 214 while overlapping the gate electrode 230. A portion of the gate insulating layer 220B overlapping the second doped region 214 may be selectively removed in a subsequent process, and in this case, a transistor substantially the same as that of FIG. 1 may be obtained.

A thickness of the selector layer 220A may be less than or equal to a thickness of a portion of the gate insulating layer 220B overlapping the gate electrode 230.

In some implementations, after each of the forming process of the first doped region 212, the forming process of the second doped region 214, and the forming process of the selector layer 220A, or after the forming process of the selector layer 220A, a heat treatment process for activating the first dopant and the second dopant may be performed. During the heat treatment process, diffusion of the first dopant and the second dopant may occur, and accordingly, both the first dopant and the second dopant may exist in an interface portion IL between the selector layer 220A and the first doped region 212. That is, the first and second dopants may be present at an interface of the selector layer 220A adjacent to the first doped region 212, and the first and second dopants may be present at an interface of the first doped region 212 adjacent to the selector layer 220A.

Figure 3:
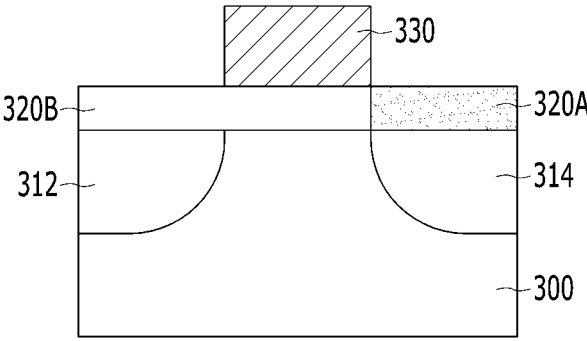
FIG. 3 is a cross-sectional view illustrating a method for fabricating a transistor based on some embodiments of the disclosed technology.

FIG. 3 is a cross-sectional view illustrating a method for fabricating a transistor based on some embodiments of the disclosed technology. The fabrication method of the transistor illustrated in FIG. 3 is different from what is illustrated in FIGS. 2A to 2C as will be discussed below.

Referring to FIG. 3, an insulating material layer and a gate electrode 330 may be formed over a substrate 300, and a first dopant may be doped into the substrate 300 at both sides of the gate electrode 330 to form first and second doped regions 312 and 314.

Subsequently, a selector layer 320A may be formed by doping a second dopant into the insulating material layer at another side, for example, a right side of the gate electrode 330 in FIG. 3. Accordingly, the selector layer 320A may overlap the second doped region 314. The gate insulating layer 320B formed by a remaining portion of the insulating material layer, except for the selector layer 320A, may overlap the gate electrode 330 and may extend to overlap the first doped region 312.

In the above-described embodiment of FIGS. 2A to 2C, the selector layer 220A may overlap the first doped region 212, for example, a source region. In some embodiments of the disclosed technology, the selector layer 320A may overlap the second doped region 314, for example, a drain region.

Figure 4:
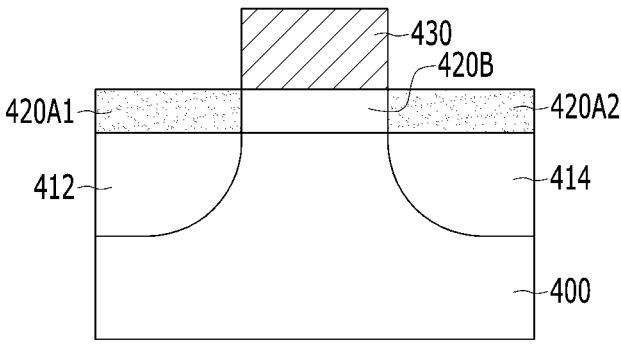
FIG. 4 is a cross-sectional view illustrating a method for fabricating a transistor based on some embodiments of the disclosed technology.

FIG. 4 is a cross-sectional view illustrating a method for fabricating a transistor based on some embodiments of the disclosed technology. The fabrication method of the transistors illustrated in FIG. 4 is different from what are illustrated in FIGS. 2A to 2C and FIG. 3 as will be discussed below.

Referring to FIG. 4, an insulating material layer and a gate electrode 430 may be formed over a substrate 400, and a first dopant may be doped into the substrate 400 at both sides of the gate electrode 430 to form first and second doped regions 412 and 414.

Subsequently, first and second selector layers 420A1 and 420A2 may be formed by doping a second dopant into the insulating material layer at both sides of the gate electrode 430. The first selector layer 420A1 may overlap the first doped region 412, and the second selector layer 420A2 may overlap the second doped region 414. A gate insulating layer 420B formed by a remaining portion of the insulating material layer, except for the first and second selector layers 420A1 and 420A2, may overlap the gate electrode 430.

That is, in some embodiments of the disclosed technology, two selector layers may overlap a source region and a drain region, respectively.

In some embodiments described above, a doped region and a selector layer may be formed by adjusting only the depth of ion implantation after forming an insulating material layer for forming a gate insulating layer. That is, an additional deposition process, and an additional mask and etching process for forming the selector layer may not be required. Thus, the process may be simplified, and the production cost may be reduced.

Only a few embodiments and examples are described. Enhancements and variations of the disclosed embodiments and other embodiments can be made based on what is described and illustrated in this patent document.

What is claimed is:

1. A transistor comprising:
a substrate;
a gate electrode disposed over the substrate;
a gate insulating layer disposed between the gate electrode and the substrate;
one or more doped regions including a first dopant and formed in the substrate; and
one or more selector layers disposed over the substrate, at least one of the one or more selector layers vertically overlapping at least one of the one or more doped regions,
wherein each of the one or more selector layers includes an insulating material layer and a second dopant that is doped in the insulating material layer, wherein the insulating material layer includes a material that is the same as a material of the gate insulating layer, and
wherein at least one of an interface portion of the selector layer adjacent to the doped region or an interface portion of the doped region adjacent to the selector layer includes the first and second dopants.

2. The transistor according to claim 1, wherein a side surface of the one or more selector layers is in direct contact with a side surface of the gate insulating layer.

3. The transistor according to claim 1, wherein a thickness of the one or more selector layers is less than or equal to a thickness of the gate insulating layer.

4. The transistor according to claim 1, wherein the dopant doped in the insulating material layer is selected to create a shallow trap that provides a passage for conductive carriers to move in the insulating material layer.

5. The transistor according to claim 1, wherein the one or more doped regions include a first doped region at one side of the gate electrode and a second doped region at another side of the gate electrode, and
the selector layer overlaps at least one of the first doped region and the second doped region.

6. A method for fabricating a transistor, comprising:
forming an insulating material layer over a substrate;
forming a gate electrode over at least a first portion of the insulating material layer;
forming a doped region at first and second regions of the substrate by implanting a first dopant into: the first region of the substrate adjacent to a side of the gate electrode; and the second region of the substrate adjacent to another side of the gate electrode;
forming a selector layer by implanting a second dopant into at least part of the insulating material layer disposed over at least one of the first region or the second region of the substrate; and
performing a heat treatment process for the first and second dopants to diffuse after the doped region is formed and after the selector layer is formed, or after the selector layer is formed.

7. The method according to claim 6, wherein a second portion of the insulating material layer is not covered by the gate electrode, wherein a thickness of the second portion of the insulating material layer is less than or equal to a thickness of the first portion of the insulating material layer.

8. The method according to claim 6, wherein at least one of the first dopant or the second dopant is implanted by performing an ion implantation process.

9. The method according to claim 6, wherein a projection range (Rp) point of the implanting of the first dopant is located in the substrate.

10. The method according to claim 6, wherein a projection range (Rp) point of the implanting of the second dopant is located in the insulating material layer.

11. The method according to claim 6, wherein at least one of an interface portion of the selector layer adjacent to the doped region or an interface portion of the doped region adjacent to the selector layer includes the first and second dopants.

12. The method according to claim 6, wherein the second dopant creates a shallow trap that provides a passage for conductive carriers to move in the insulating material layer.

* * * * *